United States Patent [19]

Watanabe et al.

[11] Patent Number: 4,668,481
[45] Date of Patent: May 26, 1987

[54] APPARATUS FOR MANUFACTURING A COMPOUND-SEMICONDUCTOR SINGLE CRYSTAL BY THE LIQUID ENCAPSULATED CZOCHRALSKI (LEC) PROCESS

[75] Inventors: Masayuki Watanabe, Yokohama; Sadao Yashiro, Tokyo, both of Japan

[73] Assignee: Kabushiki Kaisha Toshiba, Kawasaki, Japan

[21] Appl. No.: 707,810

[22] Filed: Mar. 4, 1985

[30] Foreign Application Priority Data

Apr. 23, 1984 [JP] Japan .................................. 59-80211

[51] Int. Cl.⁴ .............................................. C30B 15/10
[52] U.S. Cl. .................................... 422/249; 422/240; 156/617 SP; 156/607; 156/DIG. 83; 373/156; 373/163; 432/264; 432/265
[58] Field of Search ........................ 422/240, 241, 249; 156/607, 617 SP, DIG. 61, DIG. 83; 432/263–265; 373/155–157, 163, 164

[56] References Cited

U.S. PATENT DOCUMENTS

| | | | |
|---|---|---|---|
| 4,196,171 | 4/1980 | Watanabe et al. | 156/607 |
| 4,235,848 | 11/1980 | Sokolov et al. | 156/617 SP |
| 4,478,675 | 10/1984 | Akai | 156/DIG. 83 |
| 4,519,966 | 5/1985 | Aldinger et al. | 156/DIG. 83 |

FOREIGN PATENT DOCUMENTS

| | | | |
|---|---|---|---|
| 0146002 | 6/1985 | European Pat. Off. | |
| 3248103 | 12/1983 | Fed. Rep. of Germany | 156/DIG. 83 |
| 122682 | 9/1979 | Japan | 156/DIG. 83 |
| 157781 | 12/1979 | Japan | 156/DIG. 83 |
| 1055059 | 1/1967 | United Kingdom | |
| 1065728 | 4/1967 | United Kingdom | |
| 2109911 | 6/1983 | United Kingdom | 156/DIG. 83 |

Primary Examiner—David L. Lacey
Attorney, Agent, or Firm—Oblon, Fisher, Spivak, McClelland & Maier

[57] ABSTRACT

A compound-semiconductor single-crystal-manufacturing apparatus comprises a crucible for holding a molten raw material of GaAs and a liquid capsule element of $B_2O_3$, a crucible holder, a heat element concentrically surrounding the crucible, and a heat-shielding unit surrounding the heat element, for use in manufacturing a GaAs single crystal by progressively pulling it up from the raw molten material held in the crucible by the liquid encapsulated Czochralski (LEC) process. The heat-shielding unit and crucible holder are formed by molding a sintered aluminum nitride (AlN) element.

10 Claims, 4 Drawing Figures

F I G. 1
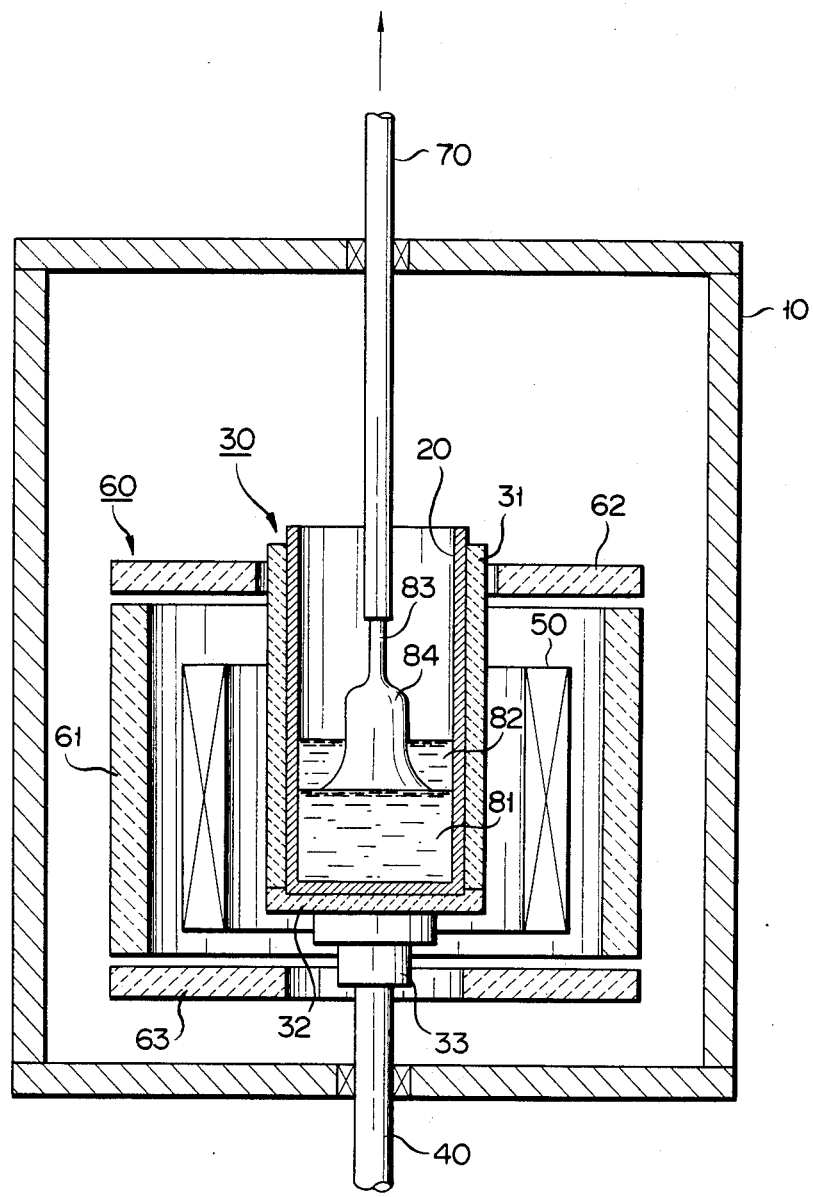

F I G. 2
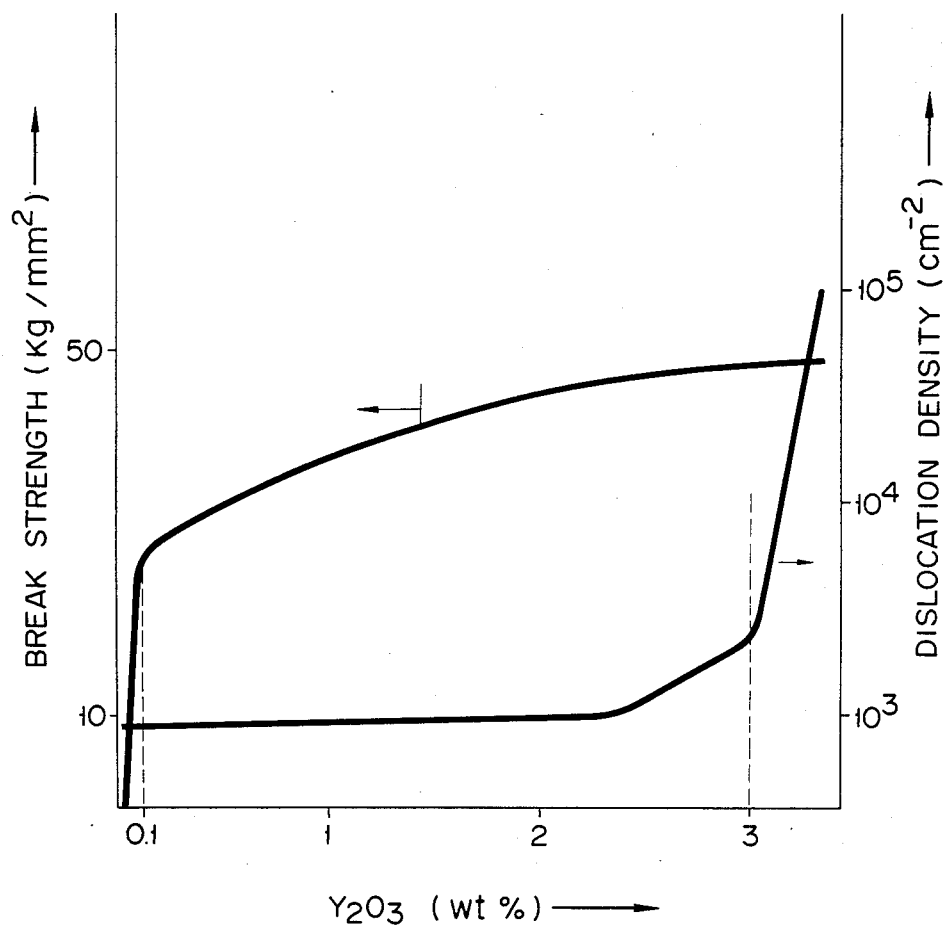

APPARATUS FOR MANUFACTURING A COMPOUND-SEMICONDUCTOR SINGLE CRYSTAL BY THE LIQUID ENCAPSULATED CZOCHRALSKI (LEC) PROCESS

BACKGROUND OF THE INVENTION

This invention relates to a compound-semiconductor single-crystal manufacturing apparatus which progressively pulls up a compound-semiconductor single crystal by the liquid encapsulated Czochralski (LEC) process.

Recently, the LEC process has been applied in the manufacture of a compound-semiconductor single crystal having a high decomposition pressure at the melting point such as GaAs, GaP InP. However, this LEC process has the drawback that since a crystal is grown at high temperature and under high pressure and a rigid heating condition for the growth of a crystal, difficulty is encountered in the stable production of a single crystal or in controlling the quality of a crystal produced.

In the LEC process, a crucible is supported in a pressure vessel by the aid of a crucible holder. The crucible is heated by a heating element concentrically surrounding the crucible. As a result, the crucible is filled with a molten raw material and a liquid capsule layer covering said raw material. The high temperature decomposition of said molten raw material is obstructed by said liquid capsule layer and pressurized inert gas. A single crystal is manufactured by being rotatingly pulled up through said liquid capsule layer. In this case, various heat shields are set up on the outside, top and bottom sides of the heat element in order to ensure the heating efficiency of the heat element and a proper temperature distribution within the crucible. These heat shields and the crucible are generally prepared from carbon material.

However, the carbon material is readily oxidized by minute amounts of, for example, oxygen and steam in the atmosphere, and deteriorated in quality. Therefore, difficulties are experienced in maintaining the efficiency of heating the crucible by the heat element and the proper temperature distribution within the crucible. Further, the molten raw material is contaminated by the growth of carbon oxides. The above-mentioned circumstances have presented considerable difficulties in maintaining a high yield of a compound-semiconductor single crystal and in maintaining its quality.

SUMMARY OF THE INVENTION

It is accordingly the object of this invention to provide a compound-semiconductor single-crystal-manufacturing apparatus which can prevent the oxidation deterioration of a heat element and a crucible holder, ensure the high efficiency of heating the crucible by the heat element and the maintenance of a proper temperature distribution within the crucible, and eliminate the contamination of a molten raw material by oxidation products, thereby elevating the yield and quality of a compound-semiconductor single crystal.

To attain the above-mentioned object, this invention provides a compound-semiconductor single-crystal-manufacturing apparatus which comprises:
a crucible for holding a molten raw material and liquid capsule element;
a crucible holder for supporting the crucible;
a heat element concentrically surrounding the crucible; and
a heat-shielding unit surrounding said heat element, thereby manufacturing a compound-semiconductor single crystal by progressively pulling it up from the molten raw material held in the crucible by the LEC process,
and wherein at least the surface of either the heat-shielding unit or crucible holder is prepared from a material mainly consisting of aluminum nitride.

The above-mentioned compound-semiconductor single-crystal-manufacturing apparatus embodying this invention offers advantages:

(i) The oxidation deterioration of the heat-shielding unit and crucible holder at a high temperature is eliminated, and the high efficiency of heating the crucible by the heat element and a proper temperature distribution within the crucible are ensured, thereby enabling a compound-semiconductor single crystal to be manufactured with high reproducibility and stability;

(ii) The contamination of the molten raw material by oxidation products is lessened, thereby elevating the quality of said single crystal;

(iii) The application of a smaller amount of carbon products of high porosity and absorption reduces the content of, for example, oxygen and steam in the atmosphere, thereby extending the life of, for example, a heat element and ensuring the preservation of its heating property. The intrusion of impurities into the molten raw material is reduced. As a result, a compound-semiconductor single crystal can be manufactured with improvement in reproducibility, stability and crystalline quality; and (iv) A considerable reduction is realized in the cost of manufacturing said single crystal due to the extension of the effective life of the heat-shielding unit, crucible holder and other parts of the subject apparatus.

BRIEF DESCRIPTION OF THE DRAWINGS

FIG. 1 is a schematic sectional view of a compound-semiconductor single-crystal-manufacturing apparatus embodying this invention;

FIG. 2 is a curve diagram showing the break strength and dislocation density of the AlN material relative to its content of $Y_2O_3$;

DETAILED DESCRIPTION OF THE PREFERRED EMBODIMENT

Figure 3A:
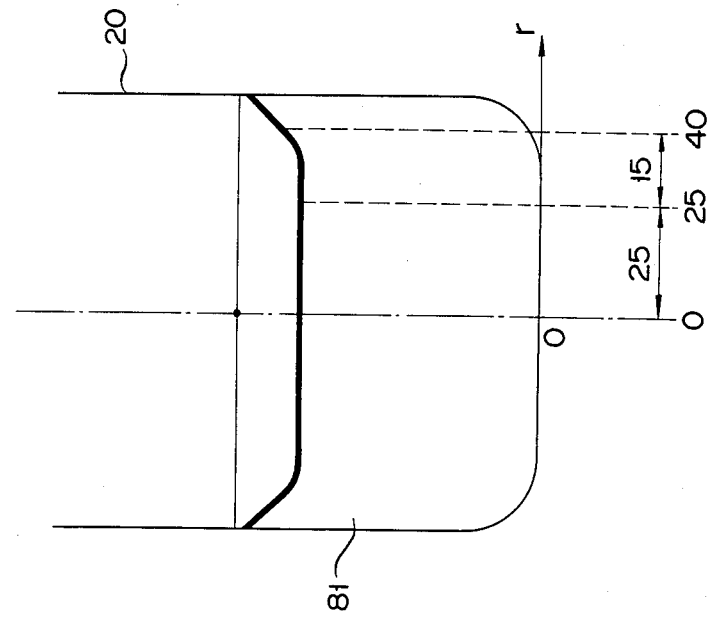
FIG. 3A typically illustrates the temperature distribution characteristic of a molten raw material as viewed crosswise of the conventional compound-semiconductor single-crystal-manufacturing apparatus.

FIG. 1 is a schematic sectional view of a compound-semiconductor single-crystal-manufacturing apparatus embodying this invention.

Reference numeral 10 represents a high pressure vessel made of, for example, stainless steel. Received in this vessel 10 are a crucible 20, crucible holder 30, heat element 50 and heat-shielding unit 60. The crucible 20 is a blind cylindrical member prepared from PBN. The crucible 20 contains the source of a molten raw material 81 such as metal Ga and As, and the source of a liquid capsule layer 82 such as $B_2O_3$. A seed crystal 83 suspended from the lower end of a crystal pullup shaft 70 penetrating the upper wall of the vessel 10 is brought into contact with the molten raw material 81. A GaAs single crystal 84 is progressively manufactured while being pulled up by the pullup shaft 70.

The crucible 20 is supported by the crucible holder 30. The crucible holder 30 is constructed by assembling together a cylinder 31, bottom plate 32 and pedestal 33. The cylinder 31 is closely attached to the crucible 20 so as to surround its outer peripheral wall. The bottom plate 32 is closely attached to the crucible 20 in contact with its base. The pedestal 33 supports the bottom plate 32. According to this invention, the cylinder 31, bottom plate 32 and pedestal 33 jointly constituting the crucible 30 are prepared from a sintered molded element of aluminum nitride (AlN) instead of carbon, which is used in the conventional compound-semiconductor single-crystal-manufacturing apparatus (herein-after simply referred to as the conventional apparatus). A mixture of AlN powder and $Y_2O_3$ used as a binder is sintered at a temperature of 1800° C. to provide the cylinder 31, bottom plate 32 and pedestal 33. The content of $Y_2O_3$ is defined to be 0.1 to 3% by weight. The reason why the content of $Y_2O_3$ is defined within the above range is that if said content is too small, the sintered mass will be reduced in breaking strength, whereas an excess $Y_2O_3$ content increases the dislocation density, as shown in FIG. 2.

The pedestal 33 of the crucible holder 30 is fitted with a rotary shaft 40 penetrating the bottom plate of the vessel 10. The crucible 20 is turned around by rotating the rotary shaft 40 by a rotation mechanism (not shown).

The cylindrical heat element 50 is spatially set around the outer peripheral wall of the crucible 20. The heat element 50 melts the raw material and capsule material held in the crucible 20, thereby providing the molten raw material 81 and overlying liquid capsule layer 82. The heat-shielding unit 60 is set around the heat element 50. This heat-shielding unit 60 is formed of a side ring 61, top plate 62 and bottom plate 63. The side ring 61 is made into a cylindrical form having a larger diameter and greater height than the heat element 50. The side ring 61 is concentrically set around the heat element 50. The top plate 62 is formed into a disc whose center is provided with a hole allowing for the insertion of the crucible 20, and is positioned above the side ring 61. The bottom plate 63 has the same shape as the top plate 62 and is set below the side ring 61. The heat-shielding unit 60 consisting of the side ring 61, top plate 62 and bottom plate 63 is prepared from an AlN sintered element like the crucible holder 30.

A description may now be made of the process of manufacturing a GaAs single crystal by the above-mentioned apparatus embodying this invention. A raw material of GaAs and $B_2O_3$ capsule material were first placed in the crucible 20. The crucible 20 was set in the pressure vessel 10 prepared from, for example, stainless steel as shown in FIG. 1. Then, argon gas was taken into the vessel 10 to pressurize its interior. The crucible 20 was heated by the heat element 50 to melt the raw material and capsule element held in the crucible 20 in such a manner that the liquid capsule layer 82 was spread over the molten raw material 81. After the melting of the raw material 81 of GaAs, its temperature was adjusted to a level suitable to provide a single crystal 84. The seed crystal 83 was brought into contact with the molten raw material of GaAs through the liquid capsule layer 82. After the seed crystal 83 and molten raw material 81 were fully wetted together, the subject crystal was manufactured by being pulled up under the following conditions:

Pullup speed: 9 mm/hr
Pullup rotation: 10 rpm
Crucible rotation: 15 rpm

Figure 3B:
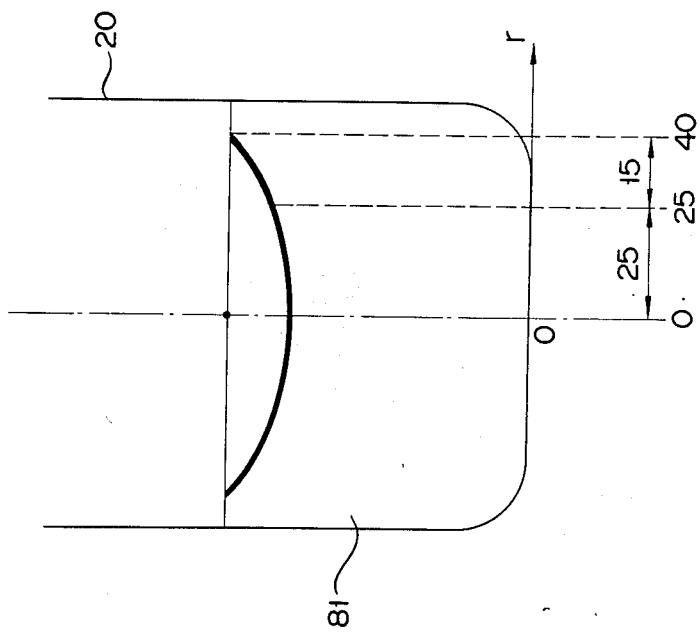
FIG. 3B typically indicates the temperature distribution characteristic of a molten raw material as viewed crosswise of a compound semiconductor single crystal-manufacturing apparatus embodying this invention.

The above-mentioned experiment showed that it was possible to ensure the heating efficiency of the heat element 50 and the proper temperature distribution within the crucible, thereby enabling the stable manufacture of a compound-semiconductor single crystal. FIG. 3A shows a temperature distribution observed when the crucible holder 30 and heat-shielding unit 60 were prepared from carbon as in the case of the conventional apparatus:

Temperature gradient at a position of r=25 mm $\Delta t/\Delta r \approx 2 [°C./cm]$ Temperature gradient at a position of r=40 mm $\Delta t/\Delta r \approx 15 [°C./cm]$ FIG. 3B indicates a temperature distribution observed in the apparatus of this invention:

Temperature gradient at a position of r=25 mm $\Delta t/\Delta r \leq 0.1 [°C./cm]$ Temperature gradient at a position of r=40 mm $\Delta t/\Delta r \leq 6 [°C./cm]$ where r is the radical distance from the center of the crucible.

As seen from FIG. 3B, the apparatus of the present invention ensured a very satisfactory temperature gradient.

With the conventional apparatus, it was rare that a single crystal was continuously pulled up. Namely, the conventional apparatus had the drawback that when the raw material-pullup steps were taken 5 times at most, a polycrystal or twin was prominently produced, making it necessary to restore proper heating conditions, for example, by the adjustment of the crucible position or the exchange of deteriorated parts. In contrast, the present apparatus enabled the single crystal pullup step to be taken continuously for more than 10 times without the readjustment of the aforementioned heating conditions. A single crystal manufactured by the conventional apparatus was contaminated by the inclusion of carbon particles having a number of $1 \times 10^{16} [cm^{-3}]$. In the compound-semiconductor single crystal manufactured by the present apparatus, however, the number of included carbon particles was decreased by ten times to $1 \times 10^{15} [cm^{-3}]$. With the conventional apparatus, a heat element and other parts generally having a short life were exchanged for fresh ones when the pullup was taken about 7 times. With the present apparatus, however, the heat element and other parts did not indicate a noticeable quality deterioration even when they were applied 15 times.

By way of comparison, experiments were made by applying a heat-shielding unit and crucible holder prepared from SiC, $Si_3N_4$ or BN. However, any of these materials failed to ensure the satisfactory heating efficiency, the proper temperature distribution within the crucible and the extension of the effective life of the subject compound-semiconductor single crystal as can be attained by the AlN material. $Si_3N_4$ and BN in particular have to be sintered with the inclusion of a binder having an amount several times larger than that which is used in the sintering of the AlN element. Therefore, the application of a heat-shielding unit and crucible holder prepared from the sintered $Si_3N_4$ or BN element is more likely to give rise to the binder contamination of the molten raw material.

It will be noted that this invention is not limited to the foregoing embodiment. Namely, if either crucible holder or heat-shielding unit is anticipated to contaminate the molten raw material, it is advised to prepare the crucible holder or heat shielding unit from aluminum nitride. When the aluminum nitride element is sintered, it is advised to mix the aluminum nitride element with not only a binder such as $Y_2O_3$ but also various additives, thereby ensuring the desired property of the aforementioned crucible holder or heat-shielding unit. Further, the same effect as the sintered aluminum nitride element can be attained by coating the surface of a molded aluminum oxide element with a layer of aluminum nitride. Obviously, this invention is applicable to manufacture not only a single crystal of GaAs but also that of InP or GaP, a semiconductor element belonging to Groups III to V. Further, the invention is applicable with various modifications without departing from the scope and object of the invention.

What is claimed is:

1. A compound-semiconductor single-crystal-manufacturing apparatus for progressively pulling up a compound-semiconductor signal crystal from a molten raw material held in a crucible by the liquid encapsulated Czochralski (LEC) process which comprises:
   a crucible for holding molten raw material and liquid capsule element;
   a crucible holder supporting and holding said crucible;
   a heat element concentrically set around said crucible and crucible holder;
   a heat-shielding unit surrounding said heat element; and
   a vessel holding said crucible, crucible holder, heat element and heat-shielding unit,
   wherein at least one of said heat-shielding unit, and crucible holder is made of a material consisting essentially of aluminum nitride (AlN).

2. The apparatus according to claim 1, wherein at least one of said heat-shieding unit and crucible holder is formed of a sintered aluminum nitride material.

3. The apparatus according to claim 2, wherein said sintered aluminum nitride material comprises a sintered mixture of aluminum nitride and yttria ($Y_2O_3$).

4. The apparatus according to claim 3, wherein said sintered aluminum nitride material contains 0.1 to 3% by weight of yttria.

5. The apparatus according to claim 1, wherein said heat-shieding unit is formed of a side ring concentrically surrounding said heat element, a top plate positioned above said side ring and a bottom plate provided below said side ring.

6. A compound-semiconductor single-crystal-manufacturing apparatus for progressively pulling up a compound-semiconductor signal crystal from a molten raw material held in a crucible by the liquid encapsulated Czochralski (LEC) process which comprises:
   a crucible for holding molten raw material and liquid capsule element;
   a crucible holder supporting holding said crucible;
   a heat element concentrically set around said crucible and crucible holder;
   a heat-shielding unit surrounding said heat element; and
   a vessel holding said crucible, crucible holder, heat element and heat-shielding unit, wherein said heat-shielding unit and crucible holder are made of a material comsisting essentially of aluminum nitride (AlN).

7. The apparatus according to claim 6, wherein said heat-shielding unit and crucible holder are formed of a sintered aluminum nitride material.

8. The apparatus according to claim 7, wherein said sintered aluminum nitride material comprises sintered aluminum nitride and yttria ($Y_2O_3$).

9. The apparatus according to claim 8, wherein said sintered aluminum niride material contains 0.1 to 3% by weight of yttria.

10. The apparatus according to claim 6, wherein said heat-shielding unit is formed of a side ring concentrically surrounding said heat element, a top plate positioned above said side ring and a bottom plate provided below said side ring.

* * * * *